United States Patent
Xiong et al.

(10) Patent No.: US 10,903,345 B2
(45) Date of Patent: Jan. 26, 2021

(54) POWER MOSFET WITH METAL FILLED DEEP SINKER CONTACT FOR CSP

(71) Applicant: Texas Instruments Incorporated, Dallas, TX (US)

(72) Inventors: Yufei Xiong, Chengdu (CN); Yunlong Liu, Chengdu (CN); Hong Yang, Richardson, TX (US); Ho Lin, Chengdu (CN); Tianping Lv, Chengdu (CN); Sheng Zou, Chengdu (CN); Qiuling Jia, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/831,112

(22) Filed: Dec. 4, 2017

(65) Prior Publication Data
US 2018/0102424 A1    Apr. 12, 2018

Related U.S. Application Data

(63) Continuation of application No. 15/342,896, filed on Nov. 3, 2016, now Pat. No. 9,865,718, which is a (Continued)

(51) Int. Cl.
  *H01L 29/66* (2006.01)
  *H01L 29/739* (2006.01)
  (Continued)

(52) U.S. Cl.
  CPC ........ *H01L 29/7397* (2013.01); *H01L 21/283* (2013.01); *H01L 21/3213* (2013.01);
  (Continued)

(58) Field of Classification Search
  CPC .......... H01L 21/76895; H01L 21/6835; H01L 21/76251; H01L 2221/68372;
  (Continued)

(56) References Cited

U.S. PATENT DOCUMENTS 4,999,684 A  *  3/1991  Temple  .................. H01L 21/78
                                                              257/517
5,777,362 A     7/1998  Pearce
(Continued)

FOREIGN PATENT DOCUMENTS

CN       104412365 A       3/2015
CN       105009296 A      10/2015

OTHER PUBLICATIONS

PCT Search Report for Application No. PCT/CN2016/087968, dated Mar. 28, 2017.

*Primary Examiner* — Vu A Vu
(74) *Attorney, Agent, or Firm* — Andrew R. Ralston; Charles A. Brill; Frank D. Cimino

(57) ABSTRACT

A method of forming an IC including a power semiconductor device includes providing a substrate having an epi layer thereon with at least one transistor formed therein covered by a pre-metal dielectric (PMD) layer. Contact openings are etched from through the PMD into the epi layer to form a sinker trench extending to a first node of the device. A metal fill material is deposited to cover a sidewall and bottom of the sinker trench but not completely fill the sinker trench. A dielectric filler layer is deposited over the metal fill material to fill the sinker trench. An overburden region of the dielectric filler layer is removed stopping on a surface of the metal fill material in the overburden region to form a sinker contact. A patterned interconnect metal is formed providing a connection between the interconnect metal and metal fill material on the sidewall of the sinker trench.

30 Claims, 10 Drawing Sheets

Related U.S. Application Data continuation of application No. PCT/CN2016/087968, filed on Jun. 30, 2016.

(51) Int. Cl.
| | | |
|---|---|---|
| *H01L 29/10* | (2006.01) | |
| *H01L 29/78* | (2006.01) | |
| *H01L 29/417* | (2006.01) | |
| *H01L 21/74* | (2006.01) | |
| *H01L 23/485* | (2006.01) | |
| *H01L 21/283* | (2006.01) | |
| *H01L 21/3213* | (2006.01) | |
| *H01L 29/40* | (2006.01) | |
| *H01L 29/06* | (2006.01) | |

(52) U.S. Cl.
CPC .......... *H01L 21/743* (2013.01); *H01L 23/485* (2013.01); *H01L 29/1095* (2013.01); *H01L 29/41766* (2013.01); *H01L 29/7396* (2013.01); *H01L 29/7809* (2013.01); *H01L 29/7813* (2013.01); *H01L 29/7816* (2013.01); *H01L 29/7827* (2013.01); *H01L 29/0623* (2013.01); *H01L 29/0649* (2013.01); *H01L 29/0653* (2013.01); *H01L 29/405* (2013.01); *H01L 29/7398* (2013.01)

(58) Field of Classification Search
CPC ............. H01L 29/7397; H01L 29/1095; H01L 29/7809; H01L 29/41766; H01L 29/7816; H01L 29/7813; H01L 21/743; H01L 29/7396; H01L 23/485; H01L 21/283; H01L 21/3213; H01L 29/7827; H01L 29/7398; H01L 29/405; H01L 29/0649; H01L 29/0623; H01L 29/0653
USPC ........................................................ 257/139
See application file for complete search history.

(56) References Cited

U.S. PATENT DOCUMENTS

| | | | |
|---|---|---|---|
| 5,998,833 A * | 12/1999 | Baliga | H01L 21/823487 257/329 |
| 6,489,217 B1 | 12/2002 | Kalnitsky et al. | |
| 7,253,474 B2 | 8/2007 | Denison et al. | |
| 7,445,996 B2 | 11/2008 | McDaniel | |
| 7,741,226 B2 * | 6/2010 | Andry | H01L 21/76898 257/170 |
| 8,084,327 B2 * | 12/2011 | Sapp | H01L 29/7827 257/E21.428 |
| 8,304,825 B2 * | 11/2012 | Garnett | H01L 29/8083 257/302 |
| 8,338,265 B2 * | 12/2012 | Coolbaugh | H01L 21/28518 257/331 |
| 8,502,346 B2 * | 8/2013 | Bhalla | H01L 27/0647 257/559 |
| 8,748,976 B1 | 6/2014 | Kocon et al. | |
| 8,766,164 B2 | 7/2014 | Sanfilippo et al. | |
| 8,803,236 B1 * | 8/2014 | Lee | H01L 29/4175 257/340 |
| 8,895,370 B2 * | 11/2014 | Frisina | H01L 29/66666 257/220 |
| 9,570,494 B1 * | 2/2017 | Jerome | H01L 27/1463 |
| 9,865,718 B1 * | 1/2018 | Xiong | H01L 29/7397 |
| 2007/0020879 A1 | 1/2007 | Baek et al. | |
| 2007/0205430 A1 | 9/2007 | Collins et al. | |
| 2011/0198721 A1 * | 8/2011 | Yang | H01L 21/76898 257/506 |
| 2013/0187246 A1 * | 7/2013 | Adkisson | H03H 9/64 257/416 |
| 2013/0270712 A1 * | 10/2013 | Chen | H01L 21/76898 257/774 |
| 2013/0320443 A1 * | 12/2013 | Levin | H01L 27/088 257/337 |
| 2014/0001596 A1 | 1/2014 | Hu et al. | |

* cited by examiner

POWER MOSFET WITH METAL FILLED DEEP SINKER CONTACT FOR CSP

CROSS REFERENCE TO RELATED APPLICATIONS

This application is a continuation of and claims priority to U.S. patent application Ser. No. 15/342,896 filed on Nov. 3, 2016, which is a continuation of International Application No. PCT/CN2016/087968 having an international filing date of Jun. 30, 2016, which designated the United States, the entireties of which are hereby incorporated by reference.

FIELD

Disclosed embodiments relate to vertical power semiconductor devices.

BACKGROUND

High power transistors frequently occupy a major portion of the chip area in a power integrated circuit (IC). Vertical high power devices occupy less area than horizontal high power devices but need contacts to carry current from the buried drain or buried collector to the surface of the substrate. Typically a sinker contact is formed by implanting dopant at a series of different energies to form a highly doped diffusion column extending from the top surface of the substrate down to the buried drain or buried collector. Even with the sinker contact diffusion during operation when high current flows through the diffusion column a significant voltage drop may occur which can limit the performance of the vertical high power transistor.

Some devices on ICs require low contact resistance for improved performance. Typically to reduce contact resistance the diffusion area is increased and multiple contacts are formed to the diffusion. This increases the area of the IC and may also increase the diffusion capacitance which can degrade IC performance.

SUMMARY

This Summary is provided to introduce a brief selection of disclosed concepts in a simplified form that are further described below in the Detailed Description including the drawings provided. This Summary is not intended to limit the claimed subject matter's scope.

In a power field effect transistors (FET) chip scale package (CSP) device, it is recognized that a deep low resistance sinker contact is generally needed extending from the top surface of the device down to the buried drain (for metal oxide semiconductor field effect transistors (MOSFETs)) or buried collector (for bipolar devices) to provide a low resistance connection to device's top surface. This enables all device terminals to be on the die's top surface in form of solder bumps (e.g., bumps on bond pads). For medium voltage power FET devices, it is recognized known sinker contact processes are no longer sufficient to produce the low ON resistance needed by the medium voltage product designs due to high resistance resulting from small critical dimensions (CDs) and the sinker contact being at least several μm deep. A deep sinker contact (>5 μm) can be needed due to the thicker epitaxial layer (epi) used to support medium voltage products (e.g., for a 40V rated device the epi may be about 5.8 μm thick, and for a 60V rated device the epi is thicker, such as being about 7.2 μm thick).

Disclosed embodiments include methods of forming sinker contacts that use metal fill material processing to only partially fill the sinker trench followed by an inner dielectric fill layer (e.g. spin on glass (SOG) and/or other dielectric materials) deposition process to complete the filling of the sinker trench. The metal fill material provides a low resistance contact because electrical contact is made along the full sidewall area and the bottom of the sinker contact, while the inner dielectric filler performs the function of essentially completely filling the sinker contact independent of the sinker depth and the sinker area.

Such processing enables significantly wider and deeper sinker contacts which overcomes the known challenges in contact metal (e.g., W) fill-including semiconductor (e.g., Si) sidewall barrier coverage and metal seams (void regions) when using known deep sinker contact processes particularly when the contact size is large and the depth increases significantly. Disclosed methods can also extend the depth of the sinker contact to a much wider range and still provide low resistance for a variety of different product design needs. More generally, disclosed methods can provide deep sinker contacts covering a wide range of depths for different FET or bipolar design requirements.

BRIEF DESCRIPTION OF THE DRAWINGS

Reference will now be made to the accompanying drawings, which are not necessarily drawn to scale, wherein.

DETAILED DESCRIPTION

Figure 1:
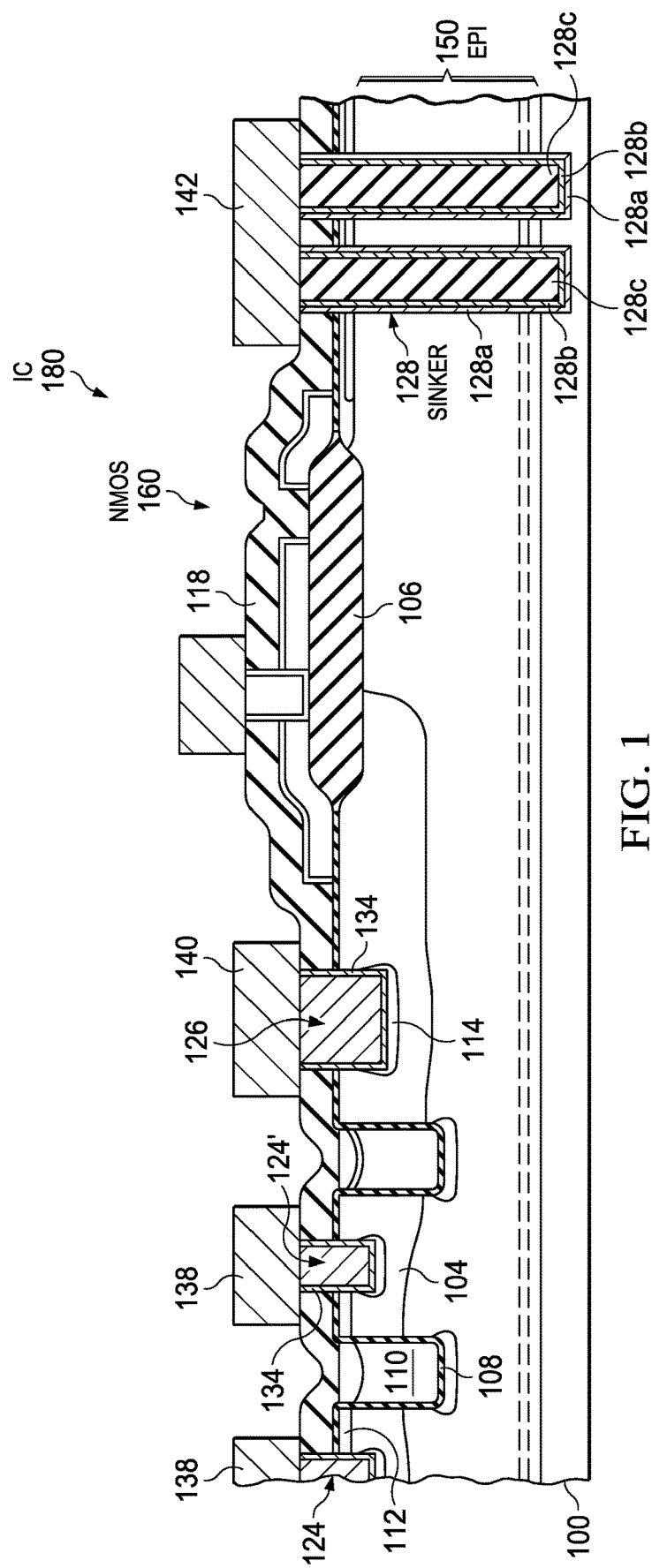
FIG. 1 is a cross sectional depiction of an integrated circuit (IC) with an example power NMOS transistor including a disclosed sinker contact, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a cross sectional depiction of an IC 180 including an example power semiconductor device comprising a vertical power NMOS transistor 160 having two disclosed low resistance sinker contacts (sinker contacts) 128 shown to its buried drain. Although NMOS and NPN transistors are generally described herein, it is clear to one having ordinary skill in the art to use this information to also form PMOS and PNP transistors, by n-doped regions being substituted by p-doping and vice versa. The power semiconductor device can thus comprise a PMOS or NMOS device in a trench gate or planar gate layout, or a PNP or NPN vertical bipolar device, or more generally any device (whether discrete or on an IC) which needs to connect from a buried device terminal (e.g., a buried terminal in a substrate having an epi layer thereon) onto the top surface of the die as an electrical node.

An n-type epitaxial (epi) layer 150 having a typical doping level of $5 \times 10^{15}$ cm$^{-3}$ to $1 \times 10^{17}$ cm$^{-3}$ is on a low resistance heavily n+ doped layer having a typical doping level of about $1 \times 10^{18}$ cm$^{-3}$ to $5 \times 10^{19}$ cm$^{-3}$, where the n+ doped layer is shown provided by a bulk n+ substrate 100 which may be about 500 μm thick. The substrate 100 and epi layer 150 can both comprise silicon, silicon-germanium, or another semiconductor material.

The sinker contacts 128 extend through the epi layer 150 (e.g., being about 5 μm thick as an example) and into the substrate 100. The sinker contacts 128 are generally lined by a barrier metal liner 128a. The barrier metal liner 128a comprises a refractory metal layer or refractory metal layer stack, such as 800 A of TiN on 600 A of Ti in one particular embodiment. The barrier metal liner 128a is also present at the bottom of the sinker contacts.

The sinker contacts 128 are further filled with a metal fill material 128b such as chemical vapor deposited (CVD) tungsten (W) or electroplated copper (on a copper seed), along with an inner dielectric filler layer 128c such as silicon oxide on the metal fill material 128b. The typical thickness range for the metal fill material 128b is 0.1 μm to 1 μm. The thickness for the dielectric filler layer 128c is based on the dimensions of the sinker trench as the dielectric filler layer 128c completes the filling of the sinker trench. Besides W and copper, the metal fill material 128b may also comprise other metals such as Ta, or a platinum group metal (PGM) such as Pt or Pd, their metal silicides, or metal alloys of such metals including Ti—W. The sinker contacts 128 form an electrical contact along the sidewalls and the bottom of the sinker contact that as shown extend through the epi layer 150 into the substrate 100. The sinker contacts 128 may be round or rectangular in shape.

The 2 horizontal dashed lines shown above the substrate 100 in the epi layer 150 are provided to indicate up diffusion of dopant (e.g., phosphorus or arsenic for an n+ substrate) from the substrate 100 into the epi layer 150. Although the sinker contact 128 is shown reaching the substrate 100, if the sinker contact 128 reaches close (say within 0.5 μm to 1 μm) of the epi layer 150/substrate 100 interface this may be sufficient to provide low resistance as that portion of the epi layer 150 under the sinker contact 128 may be sufficiently heavily doped.

To illustrate some benefits of disclosed sinker contacts 128, a power NMOS transistor 160 is used as an example. As noted above, other transistors such as a power PMOS transistor or discrete vertical power bipolar transistors may also be used. In addition, as noted above, the transistors may be discrete devices or as shown part of an IC. The source of the power NMOS transistor 160 is an n-type diffusion 112. The body of the NMOS transistor 160 is a p-well that provides a body region (body) 104 for the NMOS transistor 160. The drain of the power NMOS transistor 160 is the epi layer 150 plus the substrate 100. Gate dielectric 108 electrically isolates the transistor gate electrode 110 from the n-type diffusion 112, the epi layer 150 of the drain, and the body 104 of the NMOS transistor 160. A dielectric isolation layer 106 is shown such as a LOCOS (local oxidation of silicon) layer or STI (shallow trench isolation) layer that electrically isolates the power NMOS transistor 160 from the sinker contact 128.

The body 104 is connected by a contact plug 126 to interconnect lead 140. The contact plug 126 framed by a barrier metal layer 134 (e.g., TiN or TaN) is connected to the p-type body 104 through a heavily doped p-type diffusion 114. The n-type diffusion 112 is connected by source contact plugs 124 to the interconnect leads 138 which as with interconnect leads 140 and 142 and all other leads can comprise aluminum or copper as examples. The contact holes 124' to the body 104 are etched through a pre-metal dielectric (PMD) layer 118 and are typically filled with a barrier metal layer 134 such as titanium plus titanium nitride (Ti/TiN), and then filled with a metallic material such as CVD-W.

During operation when a sufficient voltage is applied to the gate electrode 110 of power NMOS transistor 160 relative to the body 104, for an enhancement device, a channel forms in the body 104 adjacent to the gate dielectric 108 and high current flows from the n-type diffusion 112 acting as a source through channel of the power NMOS transistor 160 and into the substrate 100 region of the drain. Since I=V/R (current=voltage/resistance), when the contact resistance of conventional sinker contacts is high the current provided by the power NMOS transistor 160 is reduced.

The sinker contacts 128 are shown extending vertically from the first layer of interconnect 142 through the PMD layer 118, through the epi layer 150 into the substrate 100 which as noted above is highly doped. This significantly reduces the contact resistance in series with the power NMOS transistor 160. The lowered resistance results in a significant increase in the high power (high current) performance of the power device here being an NMOS transistor 160.

Figure 2:
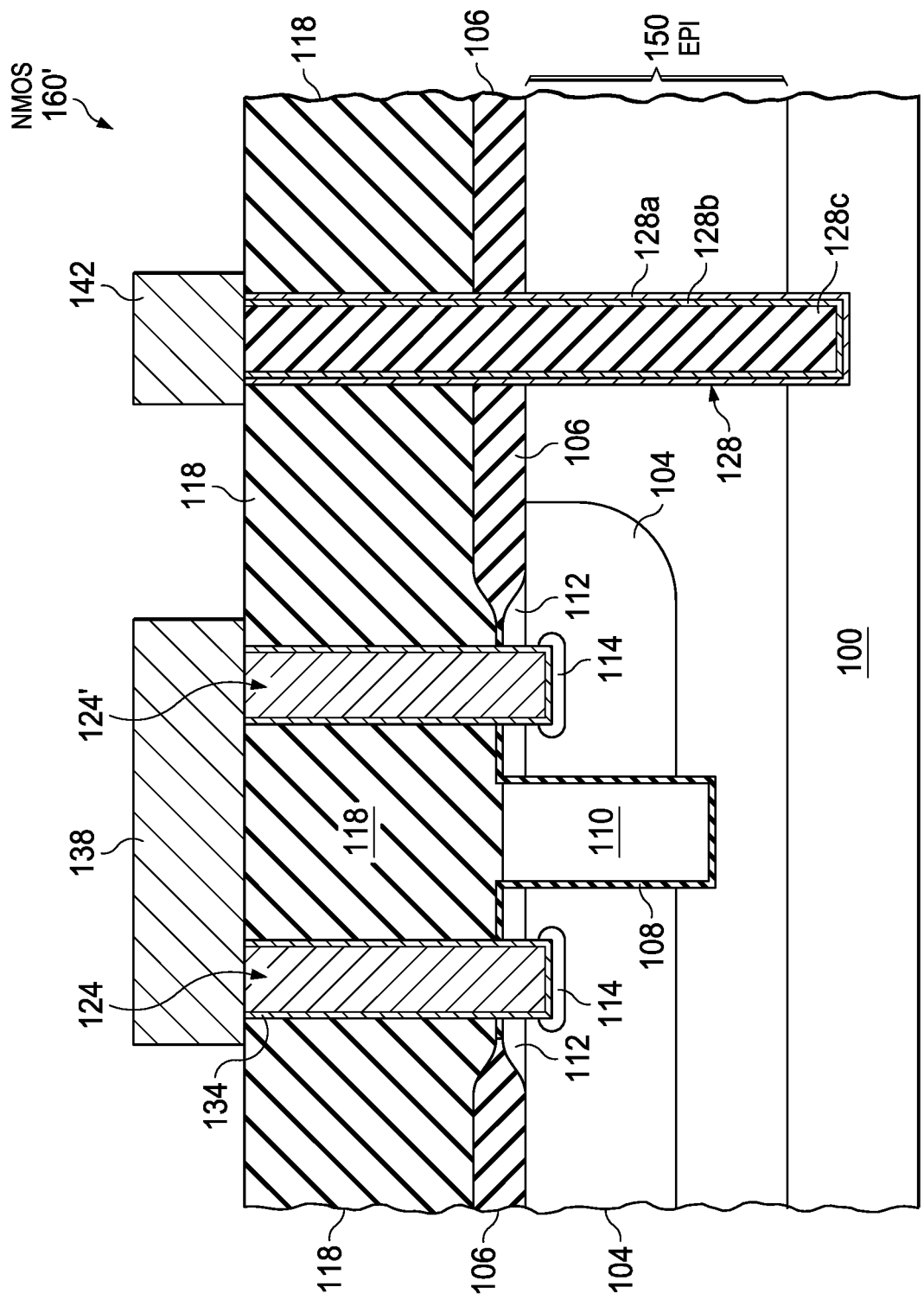
FIG. 2 is a cross sectional depiction of an example power NMOS transistor including a disclosed sinker contact.

A simplified version of the power NMOS transistor 160 shown in FIG. 1 is shown as power NMOS transistor 160' in FIG. 2. The corresponding structures in FIG. 1 and FIG. 2 are labeled with the same numbers. Source/body contacts 124,124' are formed by etching the source contacts through the n-type diffusion 112 as a source 112 and into the p-type body 104. In this version the n-type diffusion 112 as a source is shorted to the body 104 of the vertical NMOS transistor 160 which disables the body diode and enables the area of the MOS transistor to be reduced. Optional p+ diffusions as the p-type diffusion 114 may be formed under the source/body contacts 124, 124'. Power NMOS transistor 160' is unidirectional, where the sinker contact 128 is its drain terminal.

Figure 3:
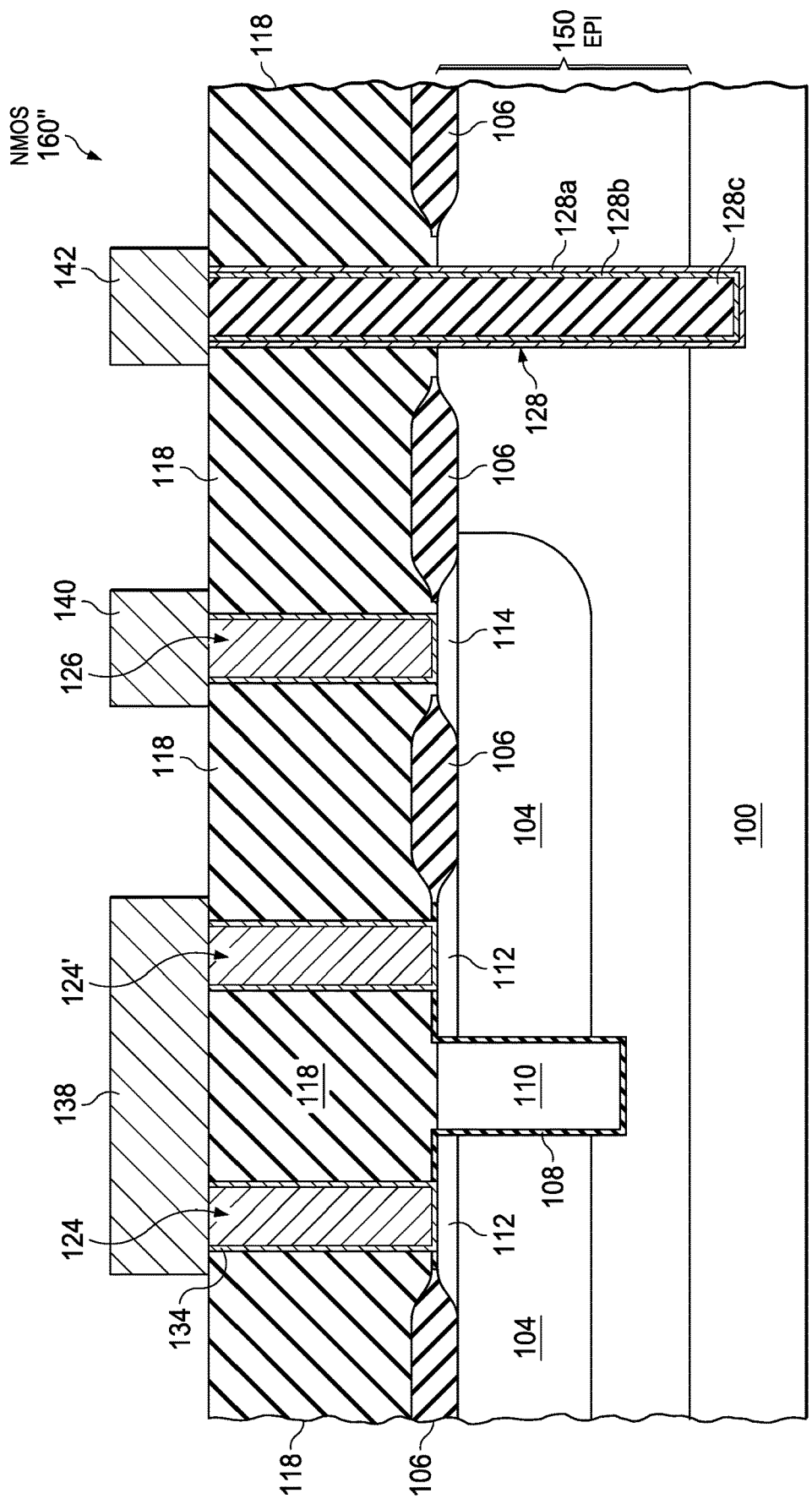
FIG. 3 is a cross sectional depiction of an example power NMOS transistor including a disclosed sinker contact.

Another simplified version of the power NMOS transistor in FIG. 1 is shown in FIG. 3 as power NMOS transistor 160". In this version the p-well contact 126 is separated from the source contact 124. The source contact 124 is only etched to the n-type diffusion 112 as a source and not into the body 104 as in FIG. 2. Power NMOS transistor 160" is bidirectional. The sinker contact 128 may be used as either a low resistance drain contact or a low resistance source contact. When Vcc is connected to the n-type diffusion 112 and Vdd is connected to the sinker contact 128 then the n-type diffusion 112 is the source and the sinker contact is the drain of the vertical NMOS transistor 160". When Vcc is connected to the sinker contact 128 and Vdd is connected to the n-type diffusion 112, then the sinker is connected to the source and the n-type diffusion 112 is the drain of the power NMOS transistor 160".

Figure 4A:
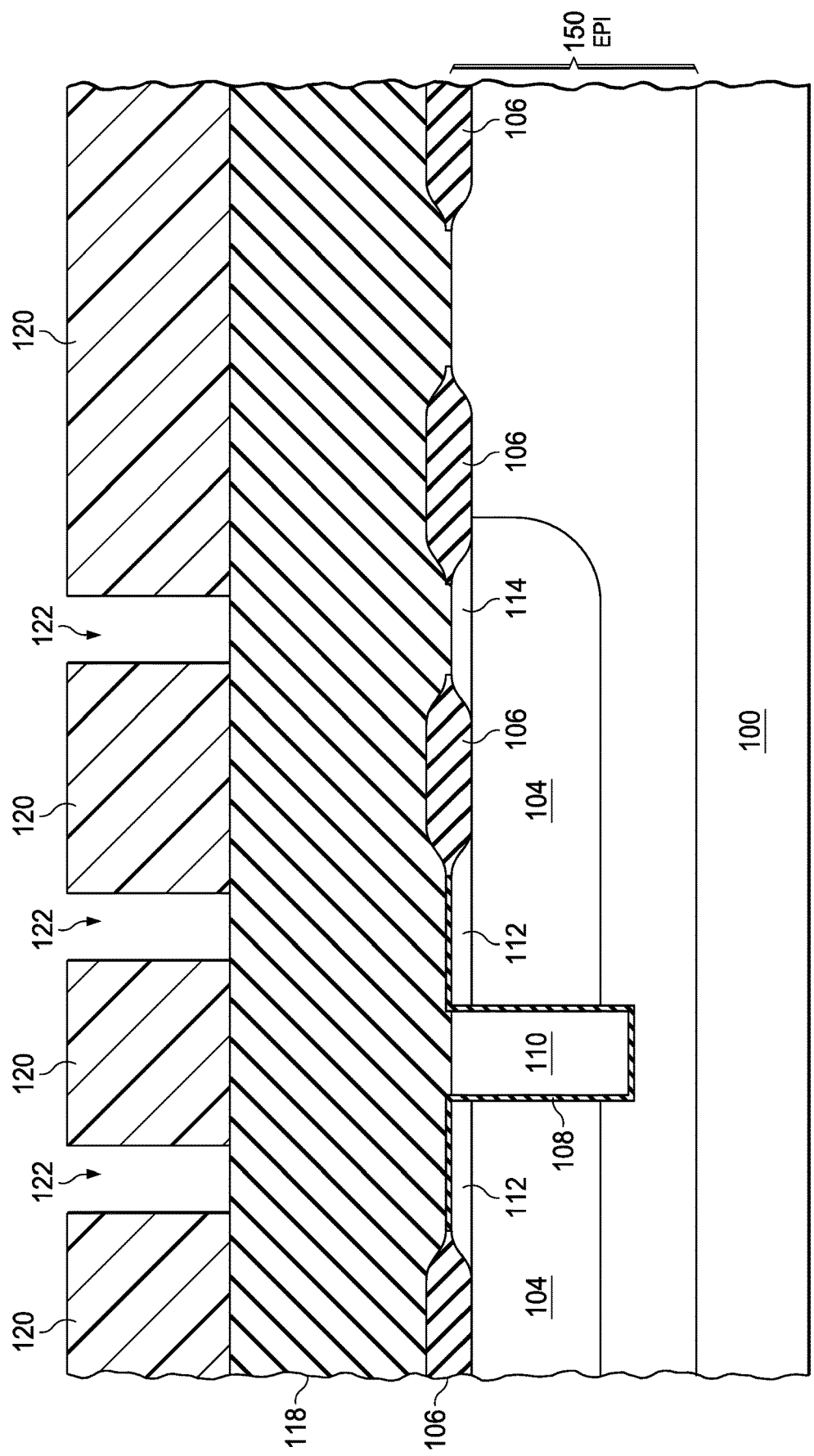
FIG. 4A through FIG. 4H are cross sectional depictions of the power NMOS transistor shown in FIG. 3 depicted in successive stages of fabrication, with FIGS. 4D-4H depicting disclosed deep sinker processing with only a first and second deep sinker shown being formed.

The major steps in the fabrication of the power NMOS transistor 160" with a sinker contact 128 shown in FIG. 3 is described below in FIGS. 4A through 4C, with the deep sinker processing with only a first and second deep sinker shown being formed in FIGS. 4D through 4H. A substrate 100 is provided having an epi layer 150 thereon with at least one transistor formed within the epi layer 150 and being covered by a PMD layer 118. A first contact pattern using a masking layer 120 (e.g., photoresist) is formed on the PMD 118 with pattern openings 122 including for the source and pwell contacts for MOS device(s) and emitter and base contacts for bipolar device(s) are formed. For example, contact openings are then etched through the PMD layer 118 to reach the source of the power NMOS transistor and to the p+ p-well body contact as shown in FIG. 4B.

Figure 4B:
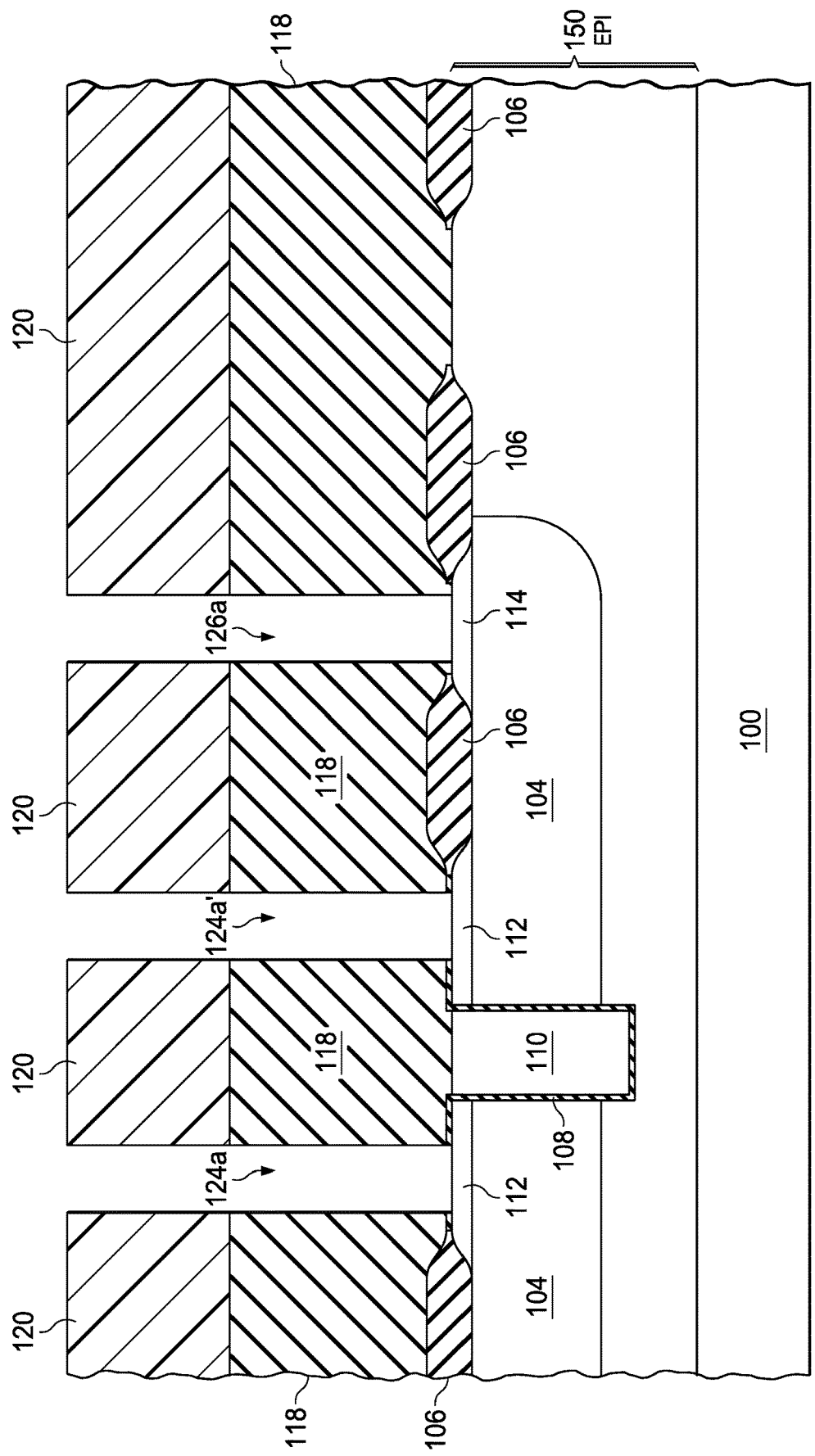
Figure 4C:
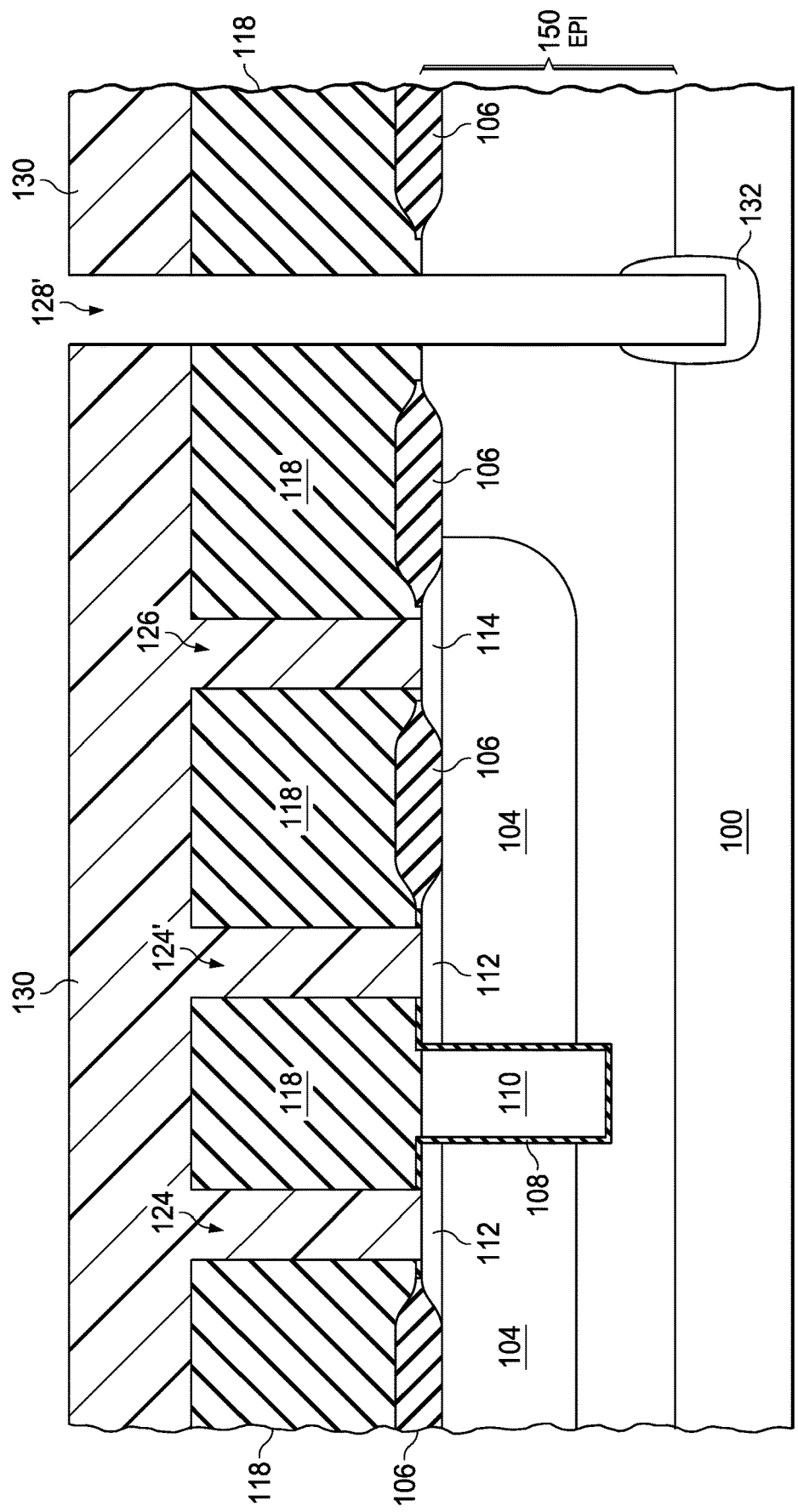

FIG. 4B shows the NMOS transistor after etching to form source contact openings 124a for source contact plugs 124 and body contact openings 124a' for body contact plugs 124' and 126a for the body contact plug 126 shown in FIG. 4C. In FIG. 4C, a separate second sinker contact pattern 130 is also formed on the device with at least one opening formed shown as sinker trench 128' where the sinker contact 128 is to be formed. The sinker trench 128' is etched through the PMD layer 118, through the epi layer 150 and generally into (or almost reaching) the substrate 100. The depth of the sinker trench 128' and thus the sinker contact 128 is generally at least 2 μm, and depends upon the thickness of the epi layer 150 which may be 5 or 7 μm thick, or more. Instead of having a contact area that is only the bottom of the contact, the contact area for the sinker contact 128 includes the bottom of the sinker contact 128 and the full sidewall area of the sinker contact that extends through the full thickness of the epi layer 150 into the substrate 100. As shown in FIG. 4C, an optional implanted region 132 with the same doping type as the substrate (n-type for this example) is shown along the sidewalls and bottom of the sinker contact 128 to add dopant to further reduce the resistance. The second contact pattern 130 is then removed.

Figure 4D:
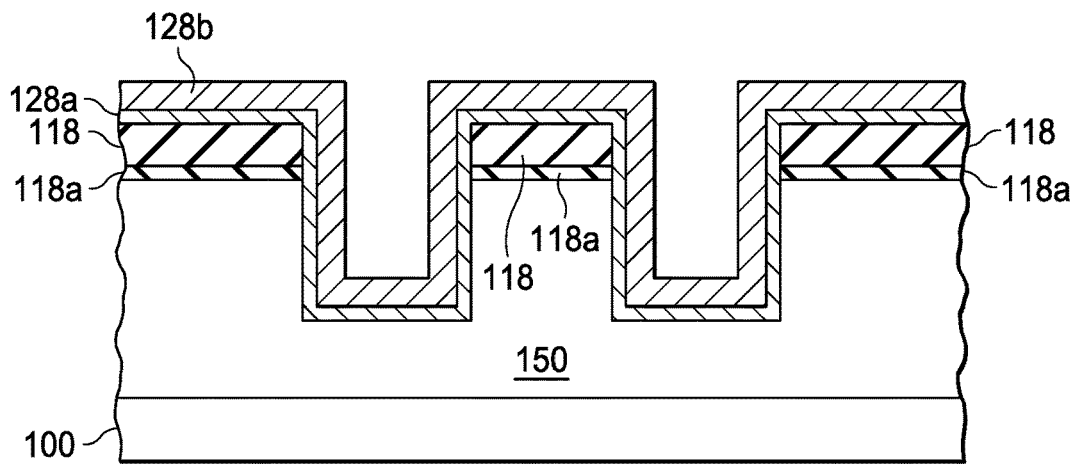

Although not shown, the barrier metal liner 128a described above is generally deposited into the contact openings to line the sinker trench 128' before depositing the metal fill material 128b. A metal fill material (temp: e.g., CVD W) 128b is then deposited, wherein as shown in FIG. 4D the metal fill material 128b covers a sidewall and bottom of the sinker trench but does not completely fill the sinker trench. The metal fill material 128b generally fills <50% of the contact area above the bottom of the sinker trench, but can be provided in any portion such as for example being in a range from 20% to 50%. A pad oxide 118a is shown beneath the PMD 118.

Figure 4E:
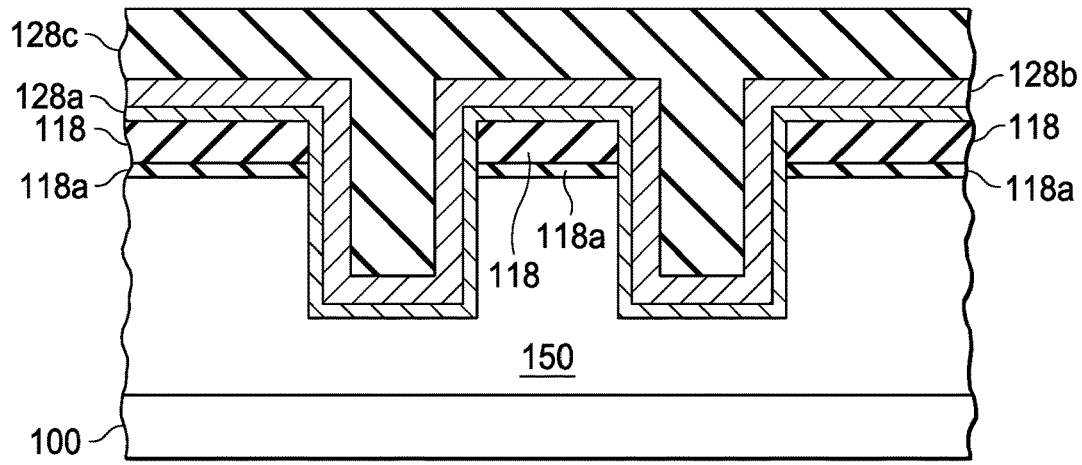

A dielectric filler layer 128c is deposited over the metal fill material 128b, wherein as shown in FIG. 4E the dielectric filler layer 128c completely fills the sinker trench. The dielectric filler layer 128c can comprise SOG, tetraethyl orthosilicate (TEOS) or a high-density plasma (HDP) CVD for filling into the remaining contact opening after the deposition of the metal fill material 128b (e.g., CVD W). SOG being in liquid form when deposited on the wafer is recognized to provide excellent trench filling properties after curing to provide sintered SOG. Sintered SOG-derived layers have a distinctive microstructure (e.g., as compared to a CVD oxide) as they have micro-porosity due to water and solvent evaporating through interconnected pores during formation which remain in part open at the surface because complete removal of the micro-porosity needs heating to about 1000° C. which is not generally provided with disclosed SOG processing. In one embodiment the dielectric filler layer 128c includes both an outer CVD liner dielectric, such as using a TEOS deposition, followed by a thicker inner sintered SOG coating that has a micro-porosity unlike CVD oxide.

Figure 4F:
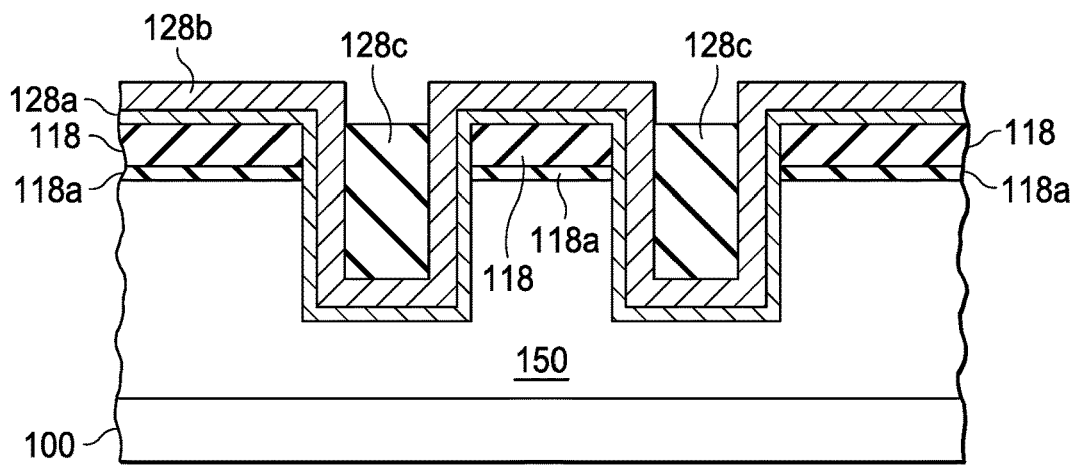
Figure 4G:
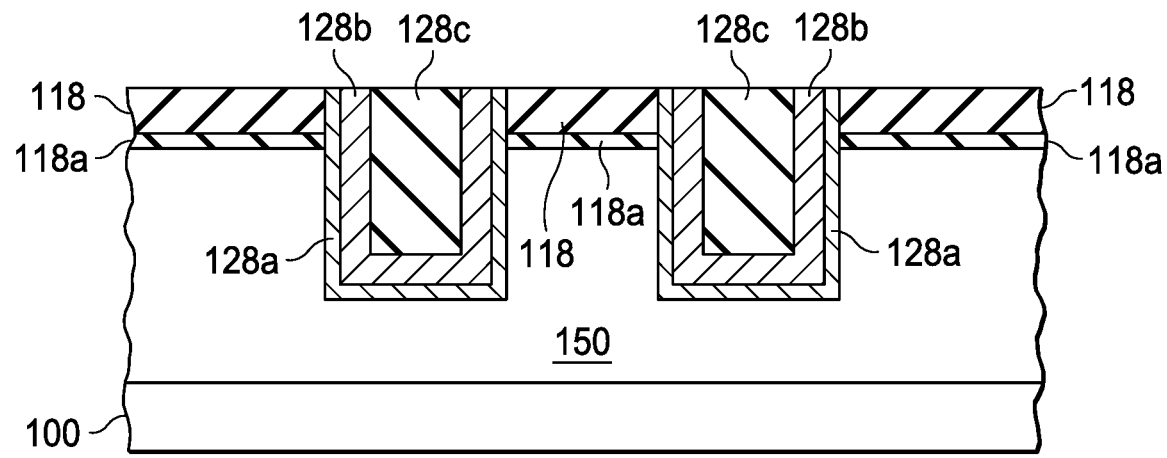
Figure 4H:
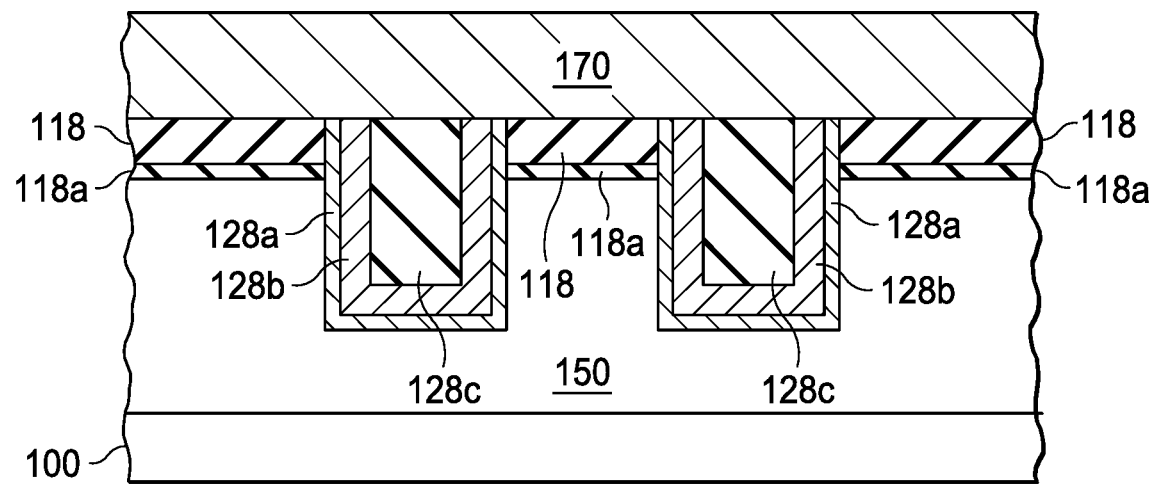

The overburden region of the dielectric filler layer 128c is removed, such as by a dry (e.g., plasma) oxide etch back or by chemical mechanical polishing (CMP) stopping on a surface of the metal fill material 128b in the overburden region. The resulting structure is shown in FIG. 4F for an oxide etch back process. The metal fill material 128b is etched back to remove the overburden region with resulting structure shown in FIG. 4G. A patterned interconnect metal layer 170 is shown formed to provide a connection between the interconnect metal layer 170 and the metal fill material 128b on the sidewall of the sinker, with the resulting structure is shown in FIG. 4H.

The use of metal fill material 128b that only partially fills the sinker trench followed by dielectric (e.g. SOG) fill enables significantly wider and deeper sinker contacts which overcomes the significant challenges in contact barrier/metal fill (e.g., W) coverage with known deep sinker contact processes particularly when the contact size and depth increase significantly. Disclosed methods can also lower the aspect ratio of the sinker contact and extend the depth of the sinker contact to a much wider range and still provide a low resistance sinker contact for a variety of different product design needs.

Figure 5:
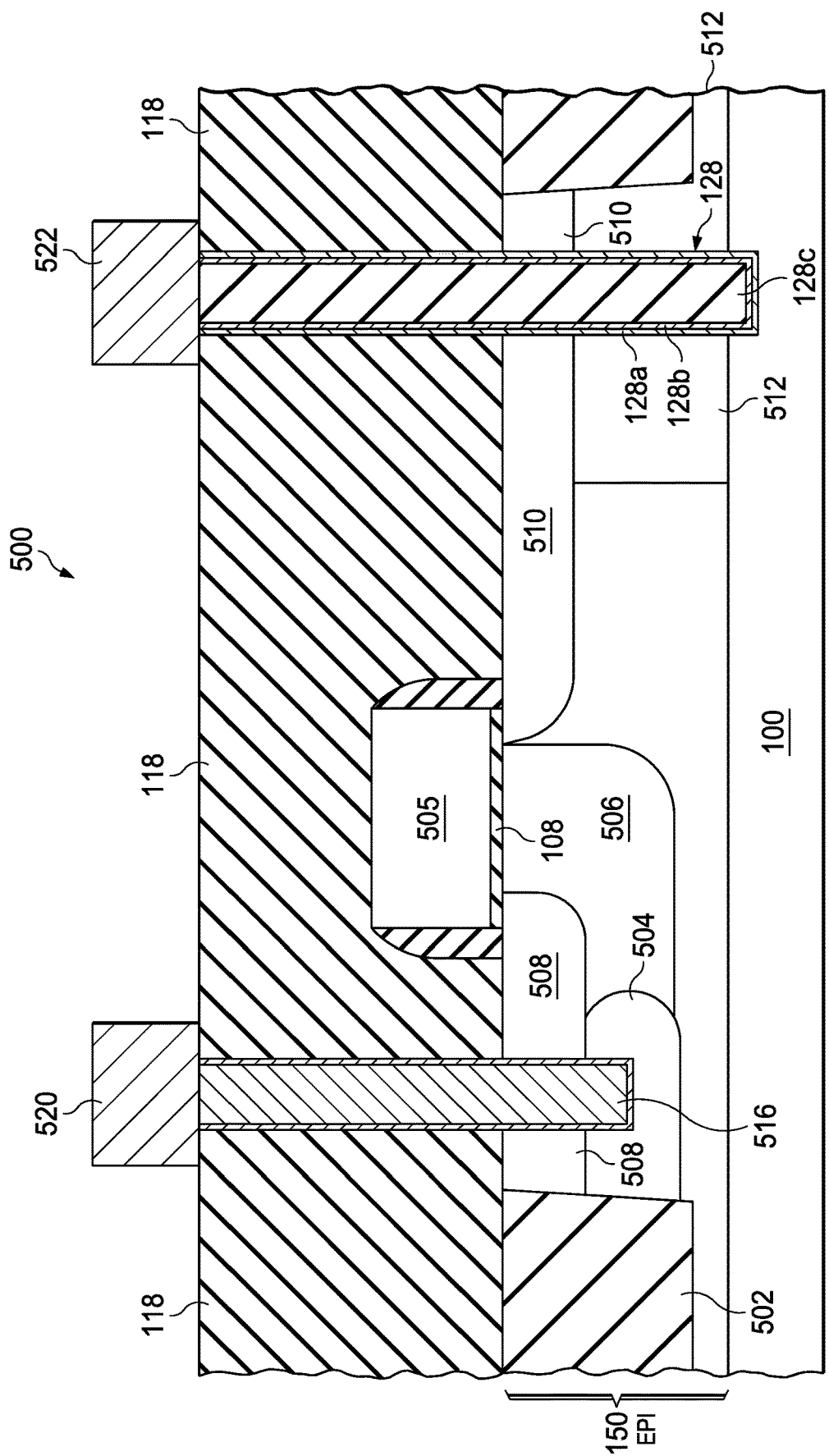
FIG. 5 is a cross sectional depiction of a power NMOS transistor with a disclosed sinker contact to its drain.

A planar high power NMOS transistor 500 with a disclosed sinker contact 128 is shown in FIG. 5 formed on an epi layer 150 that is on a substrate 100. Typically, the backside of the substrate 100 is the drain. In some circuits this presents the problem of providing power to both the topside and bottom side of the semiconductor device/IC as well as sinking the heat generated during operation of the power NMOS transistor 500.

As shown in FIG. 5 a sinker contact 128 is used to electrically connect the heavily doped substrate 100 or other buried n+ layer to the power supply using topside only contacts. The source 508 of the power NMOS transistor 500 is a heavily doped n-type diffusion, while the body 506 (e.g., a pwell) is shorted to the source 508 through a heavily doped p-type diffusion 504 and contact 516. When a sufficient voltage is applied to the gate electrode 505 that is on a gate dielectric layer 108 with respect to the body 506, a channel forms in the body 506 under the gate electrode 505 and current flows through the n-type drain diffusion 510, the n-doped sinker diffusion 512, and the heavily doped n-type layer shown as substrate 100.

The sinker contact 128 connects the substrate 100 and the n-doped sinker diffusion 512 to topside interconnect 522. A topside interconnect 520 is shown coupling to the p-type diffusion 504. The sinker contact 128 enables both Vcc and Vdd to be supplied from the topside of the power NMOS transistor 500. The power NMOS transistor 500 with a sinker contact 128 is illustrated as a unidirectional NMOS transistor with a source/body shorted contact. Although FIG. 5 shows a power MOS transistor 500 with a sinker contact 128, it could equally well have been illustrated with a bidirectional NMOS high power transistor or with a unidirectional or bidirectional PMOS high power transistor.

Figure 6:
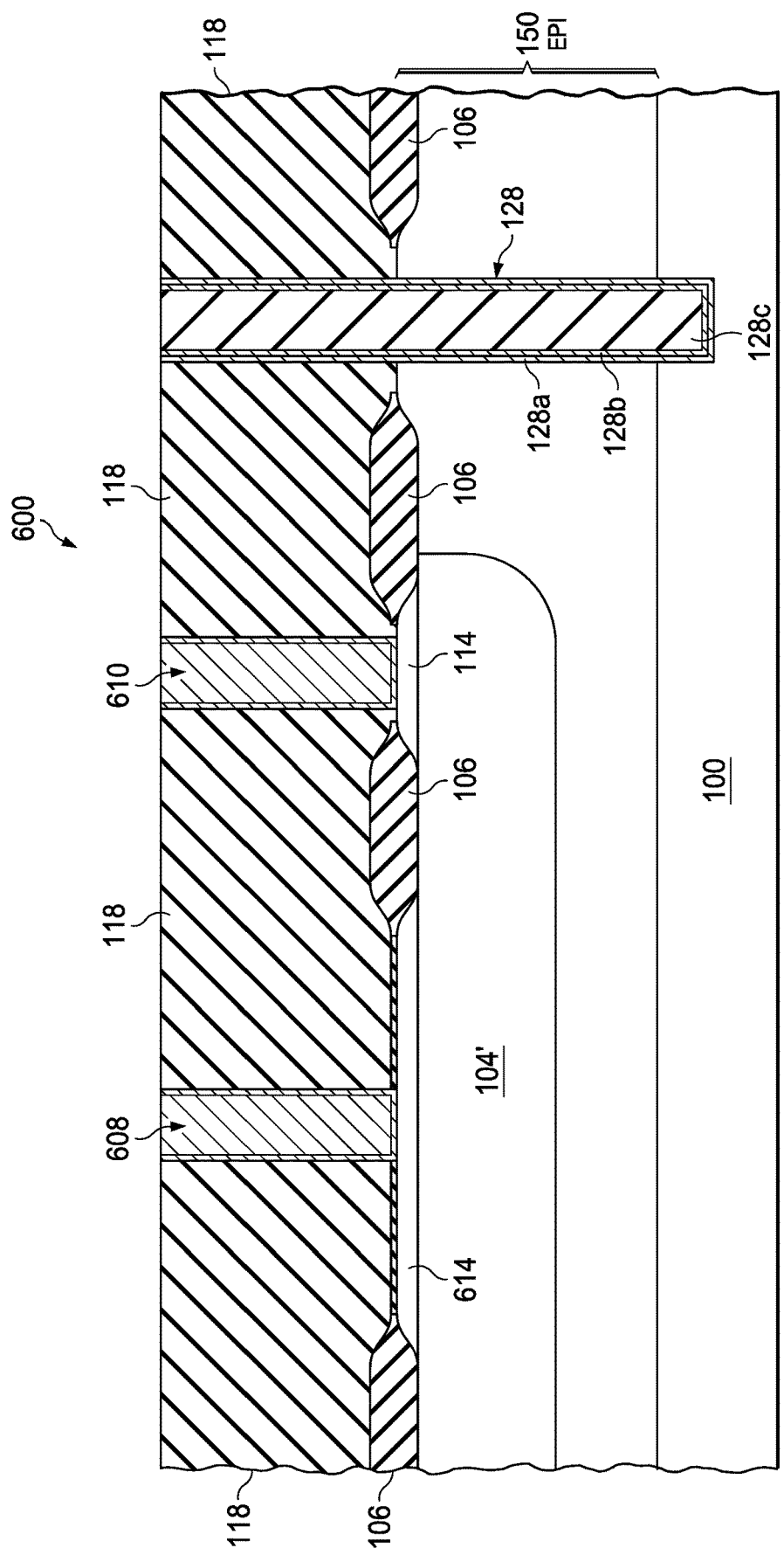
FIG. 6 is a cross sectional depiction of a power NPN bipolar transistor with a disclosed sinker contact to its collector.

A high power vertical NPN bipolar transistor 600 with a disclosed sinker contact 128 is illustrated in FIG. 6. The NPN bipolar transistor 600 includes a heavily doped n-type emitter diffusion 614, a lightly doped ptype base diffusion (p-base) 104', and an n-type collector diffusion comprised of an n-type epi layer 150 on top of a heavily doped n+ layer shown as a substrate 100. The heavily doped collector provides low resistance for handling high current. The sinker contact 128 provides a low resistance path through the relatively lightly doped epi layer 150 significantly improving the performance of the NPN bipolar transistor 600. Contact plug 608 provides an electrical connection through PMD layer 118 to the emitter 614. Contact plug 610 contacts the heavily doped p-type diffusion 114 which provides electrical contact to the p-base 104'.

EXAMPLES

Disclosed embodiments are further illustrated by the following specific Examples, which should not be construed as limiting the scope or content of this Disclosure in any way.

An example power NMOS transistor was formed on an epi layer that was about 5 µm thick on an n+ substrate, both the epi layer and substrate comprising silicon. The sinker contact was formed by sinker contact (CT) photolithography/etching/photoresist removal having a perimeter (CD>3.5 um) to form a sinker trench having a recess depth (depth in the silicon) of about 5.2 µm. The barrier metal liner 128a comprised Ti and TiN. The metal fill material 128b comprised 7 kA of W that was a W-CVD, which only partially filled the sinker trench. The dielectric filler layer 128c deposition comprised 5.5 kA of a liner dielectric using a TEOS deposition process followed by about a 2 µm thick liquid SOG coating followed by curing (at 400° C. for 40 min) of the SOG to provide sintered SOG. An oxide CMP, then etching back of the W metal fill material 128b, and finally an aluminum interconnect deposition and patterning followed.

Although disclosed low resistance sinker contacts are illustrated for high power semiconductor devices, such low resistance sinker contacts may be formed on any type of semiconductor device/IC that can benefit from a low resistance sinker in a small area. For example, the usual method of reducing contact resistance is to form multiple contacts or an array of contacts to the diffusion. Sometimes the area of the diffusion is increased to accommodate multiple contacts. One disclosed low resistance sinker contact can generally provide a lower resistance as compared to an array of multiple typical contacts. In addition to lower contact resistance disclosed sinker contacts enable a diffusion with smaller area to be formed which also benefits the circuit performance by reducing the diode capacitance.

Disclosed embodiments can be used to form semiconductor die including discrete or IC die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A semiconductor device comprising:
    an electronic device formed in or over a semiconductor substrate and having a device terminal;
    a dielectric layer located over the electronic device and having a top surface;
    a contact comprising:
        an opening extending from the top surface into the semiconductor substrate toward the device terminal;
        a dielectric filler disposed within the opening and ending at the top surface; and
        a metal-containing layer that touches the dielectric layer and the device terminal at a sidewall of the opening and is disposed within the opening between the dielectric filler and the semiconductor substrate and ends at the top surface.

2. The semiconductor device of claim 1, wherein the metal-containing layer comprises at least one of tungsten (W), copper (Cu), platinum (Pt), palladium (Pd), or a titanium alloy.

3. The semiconductor device of claim 1, wherein the dielectric filler comprises a spin on glass (SOG) coating.

4. The semiconductor device of claim 1, wherein the metal-containing layer is conductively connected to the device terminal.

5. The semiconductor device of claim 1, wherein the device terminal includes a heavily doped layer, and the opening extends to the heavily doped layer through an epitaxial (epi) layer that has a lower dopant concentration than the heavily doped layer.

6. The semiconductor device of claim 5, wherein the epi layer is at least 5 µm thick and a distance separating the bottom of the opening and an interface between the epi layer and the heavily doped layer is between 0.5 µm and 1 µm.

7. The semiconductor device of claim 1, wherein:
    the semiconductor substrate includes an epitaxial (epi) layer of a first conductivity type, and the device terminal is a first device terminal;
    the semiconductor device includes a second device terminal that includes a diffusion region of the first conductivity type disposed in a well region within the epi layer; and
    the well region is of a second conductivity type that is opposite the first conductivity type.

8. The semiconductor device of claim 7, wherein the first conductivity type is n-type and the second conductivity type is p-type.

9. The semiconductor device of claim 7, comprising a dielectric isolation structure formed at least partially in the well region and electrically isolating the second device terminal from a third device terminal.

10. The semiconductor device of claim 1, wherein the metal-containing layer covers both the sidewall of the opening and a bottom of the opening.

11. The semiconductor device of claim 10, wherein the metal-containing layer includes a barrier metal liner touching the semiconductor substrate and disposed between a metal fill material and the sidewall and the bottom of the opening.

12. The semiconductor device of claim 11, wherein the barrier metal liner includes a first layer of titanium nitride (TiN) and a second layer of titanium (Ti) disposed over the first layer.

13. The integrated circuit of claim 1, further comprising a metal interconnect that touches the dielectric layer, the metal-containing layer and the dielectric filler.

14. The semiconductor device of claim 11, wherein the metal fill material comprises elemental copper, tungsten, or a platinum group metal.

15. The semiconductor device of claim 1, wherein the substrate includes an epitaxial layer over a heavily-doped layer into which the opening extends.

16. A method of forming an integrated circuit (IC) including a semiconductor device, the method comprising:
    forming a transistor in or over an epitaxial (epi) layer disposed over a substrate;
    forming a pre-metal dielectric layer over the epi layer and covering the transistor;
    etching a contact opening through the pre-metal dielectric layer and a portion of the epi layer, wherein the contact opening includes a sidewall and a bottom and has a first portion that extends through the pre-metal dielectric layer and a second portion that extends through at least a portion of the epi layer;
    depositing a metal-containing layer in the contact opening so that the metal-containing layer touches the epi layer and the substrate at the sidewall of the contact opening, but does not completely fill the second portion of the contact opening;
    depositing a dielectric filler layer within the contact opening such that the metal-containing layer isolates the dielectric filler layer from the epi layer; and
    forming a patterned interconnect metal that conductively connects to the metal-containing layer in the contact opening and covers the dielectric filler layer.

17. The method of claim 16, further comprising removing an overburden region of the dielectric filler layer over the pre-mariatal dielectric layer to form a contact, wherein a portion of the dielectric filler layer remains in the contact opening after removing the overburden region.

18. The method of claim 16, wherein the dielectric filler layer comprises a spin-on glass (SOG).

19. An integrated circuit, comprising:
    a semiconductor substrate having a first surface;
    an electronic device formed in or over the substrate and having a terminal located below the first surface;
    a dielectric layer located over the electronic device and having a top surface;
    a via that provides a conductive path between the top surface and the terminal, the via including a dielectric core and a conductive layer that isolates the dielectric core from the substrate, the dielectric core and the conductive layer ending at the top surface of the dielectric layer.

20. The integrated circuit of claim 19, wherein the dielectric core comprises a spin-on glass (SOG).

21. The integrated circuit of claim 19, wherein the conductive layer includes a barrier metal sublayer located between a metal fill material and the semiconductor substrate.

22. The integrated circuit of claim 19, further comprising a metal interconnect that touches the dielectric layer, the conductive layer and the dielectric core.

23. The integrated circuit of claim 19, wherein the electronic device includes a vertical power transistor, and the terminal is a drain terminal of the power transistor.

24. The semiconductor device of claim 21, wherein the metal fill material comprises elemental copper, tungsten, or a platinum group metal.

25. An integrated circuit, comprising:
    an electronic device formed in or over a semiconductor substrate;
    a dielectric layer located over the electronic device;
    a metal lead located over the dielectric layer;
    a contact comprising:
        an opening extending from the metal lead toward the semiconductor substrate;
        a metal-containing layer on a sidewall of the opening and touching the metal lead; and
        a dielectric filler disposed within the opening on the metal-containing layer and touching the metal lead.

26. A semiconductor device comprising:
    a dielectric layer located over a semiconductor substrate;
    a contact comprising:
        an opening extending from a top surface of the dielectric layer toward the semiconductor substrate;
        a metal-containing layer over a sidewall of the opening; and
        a dielectric filler disposed within the opening on the metal-containing layer;
    a metal lead located over the dielectric filler, the metal lead conductively connected to the metal-containing layer.

27. The semiconductor device of claim 26, wherein the metal-containing layer includes a copper layer.

28. The semiconductor device of claim 26, wherein the metal-containing layer includes a tungsten layer.

29. The semiconductor device of claim 26, wherein the metal-containing layer includes a platinum group metal layer.

30. The semiconductor device of claim 26, wherein the substrate includes an epitaxial layer through which the opening extends to a heavily-doped layer.

* * * * *